(12) United States Patent
Yamada

(10) Patent No.: US 11,073,256 B2
(45) Date of Patent: Jul. 27, 2021

(54) LIGHT-EMITTING DEVICE

(71) Applicant: NICHIA CORPORATION, Anan (JP)

(72) Inventor: Motokazu Yamada, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 16/903,774

(22) Filed: Jun. 17, 2020

(65) Prior Publication Data
US 2020/0309344 A1 Oct. 1, 2020

Related U.S. Application Data

(63) Continuation of application No. 16/118,056, filed on Aug. 30, 2018, now Pat. No. 10,718,487.

(30) Foreign Application Priority Data

Aug. 31, 2017 (JP) .............................. JP2017-167944
Jul. 11, 2018 (JP) .............................. JP2018-131915

(51) Int. Cl.
H01L 33/50 (2010.01)
F21V 7/00 (2006.01)
(Continued)

(52) U.S. Cl.
CPC ........ *F21V 7/0083* (2013.01); *H01L 25/0753* (2013.01); *H01L 33/0075* (2013.01);
(Continued)

(58) Field of Classification Search
None
See application file for complete search history.

(56) References Cited

U.S. PATENT DOCUMENTS 9,882,094 B2 1/2018 Ng et al.
2010/0038657 A1* 2/2010 Higuchi .................. F21S 8/02
257/88
(Continued)

FOREIGN PATENT DOCUMENTS

EP 2 863 113 A1 4/2015
JP 2011-181219 A 9/2011
(Continued)

*Primary Examiner* — Ali Naraghi
(74) *Attorney, Agent, or Firm* — Birch, Stewart, Kolasch & Birch, LLP

(57) ABSTRACT

A light-emitting device includes a base member, a plurality of light sources on or above an upper surface of the base member, and a reflector that comprises a plurality of surrounding portions. Each of the plurality of surrounding portions surrounds a respective one of the plurality of light sources in a plan view. Each of the plurality of surrounding portions has inclined lateral surfaces widened upward. Intervals between adjacent ones of the plurality of light sources are constant in the plan view. Upper peripheries of the inclined lateral surfaces of each of the plurality of surrounding portions define an opening having a substantially rectangular shape. The plurality of surrounding portions include a plurality of first surrounding portions and a plurality of second surrounding portions surrounding the plurality of first surrounding portions. An area of the opening of each of the plurality of second surrounding portions is smaller than an area of the opening of each of the plurality of first surrounding portions.

22 Claims, 10 Drawing Sheets

(51) Int. Cl.
    *H01L 33/56*     (2010.01)
    *H01L 33/46*     (2010.01)
    *H01L 33/00*     (2010.01)
    *H01L 25/075*     (2006.01)
    *H01L 33/60*     (2010.01)
    *F21Y 105/10*     (2016.01)
    *F21Y 115/10*     (2016.01)

(52) U.S. Cl.
    CPC .............. *H01L 33/46* (2013.01); *H01L 33/50* (2013.01); *H01L 33/56* (2013.01); *F21Y 2105/10* (2016.08); *F21Y 2115/10* (2016.08); *H01L 33/60* (2013.01)

(56) References Cited

U.S. PATENT DOCUMENTS

| | | |
|---|---|---|
| 2012/0147589 A1 | 6/2012 | Farmer |
| 2013/0051017 A1* | 2/2013 | Heim ................... F21V 7/0083 362/247 |
| 2013/0215611 A1 | 8/2013 | Wong et al. |
| 2013/0265751 A1 | 10/2013 | Edmond et al. |
| 2014/0027807 A1* | 1/2014 | Tasaki .................... H01L 33/58 257/98 |
| 2016/0293803 A1 | 10/2016 | Kim et al. |

FOREIGN PATENT DOCUMENTS

| | | |
|---|---|---|
| JP | 2013-247038 A | 12/2013 |
| JP | 2017-92021 A | 5/2017 |
| WO | WO 2012/023459 A1 | 2/2012 |

\* cited by examiner

LIGHT-EMITTING DEVICE

CROSS-REFERENCE TO RELATED APPLICATIONS

This application is a Continuation of copending application Ser. No. 16/118,056, filed on Aug. 30, 2018, which claims priority under 35 U.S.C. § 119(a) to Application No. 2017-167944, filed in Japan on Aug. 31, 2017, and Application No. 2018-131915, filed in Japan on Jul. 11, 2018, all of which are hereby expressly incorporated by reference into the present application.

BACKGROUND OF THE INVENTION

1. Field of the Invention

The present disclosure relates to a light-emitting device.

2. Description of Related Art

Light-emitting devices each including a plurality of light sources have been proposed (see WO 2012/023459).

SUMMARY OF THE INVENTION

In a conventional light-emitting device, the luminance at an outer peripheral portion of the light-emitting device may be lower than the luminance at the central portion of the light-emitting device. This is because light emitted from other portions of the light emitting device easily reach the central portion of the light-emitting device but does not easily reach the outer peripheral portion of the light-emitting device.

The present invention is made in view of the problem as described above.

According to one embodiment of the present invention, a light-emitting device includes a base member, a plurality of light sources on or above an upper surface of the base member, and a reflector that comprises a plurality of surrounding portions. Each of the plurality of surrounding portions surrounds a respective one of the plurality of light sources in a plan view. Each of the plurality of surrounding portions has inclined lateral surfaces widened upward. Intervals between adjacent ones of the plurality of light sources are constant in the plan view. Upper peripheries of the inclined lateral surfaces of each of the plurality of surrounding portions define an opening having a substantially rectangular shape. The plurality of surrounding portions include a plurality of first surrounding portions and a plurality of second surrounding portions surrounding the plurality of first surrounding portions. An area of the opening of each of the plurality of second surrounding portions is smaller than an area of the opening of each of the plurality of first surrounding portions.

In the light-emitting device as described above, the light density over the surrounding portions at the outer peripheral portion of the light-emitting device can be higher than the light density over the surrounding portions at the central portion of the light-emitting device. Accordingly, a luminance similar to the luminance at the central portion of the light-emitting device can be obtained at the outer peripheral portion of the light-emitting device, so that the luminance over the light-emitting device can be closer to uniform throughout the device.

DETAILED DESCRIPTION OF EMBODIMENTS

Light-Emitting Device 1 According to First Embodiment

Figure 1A:
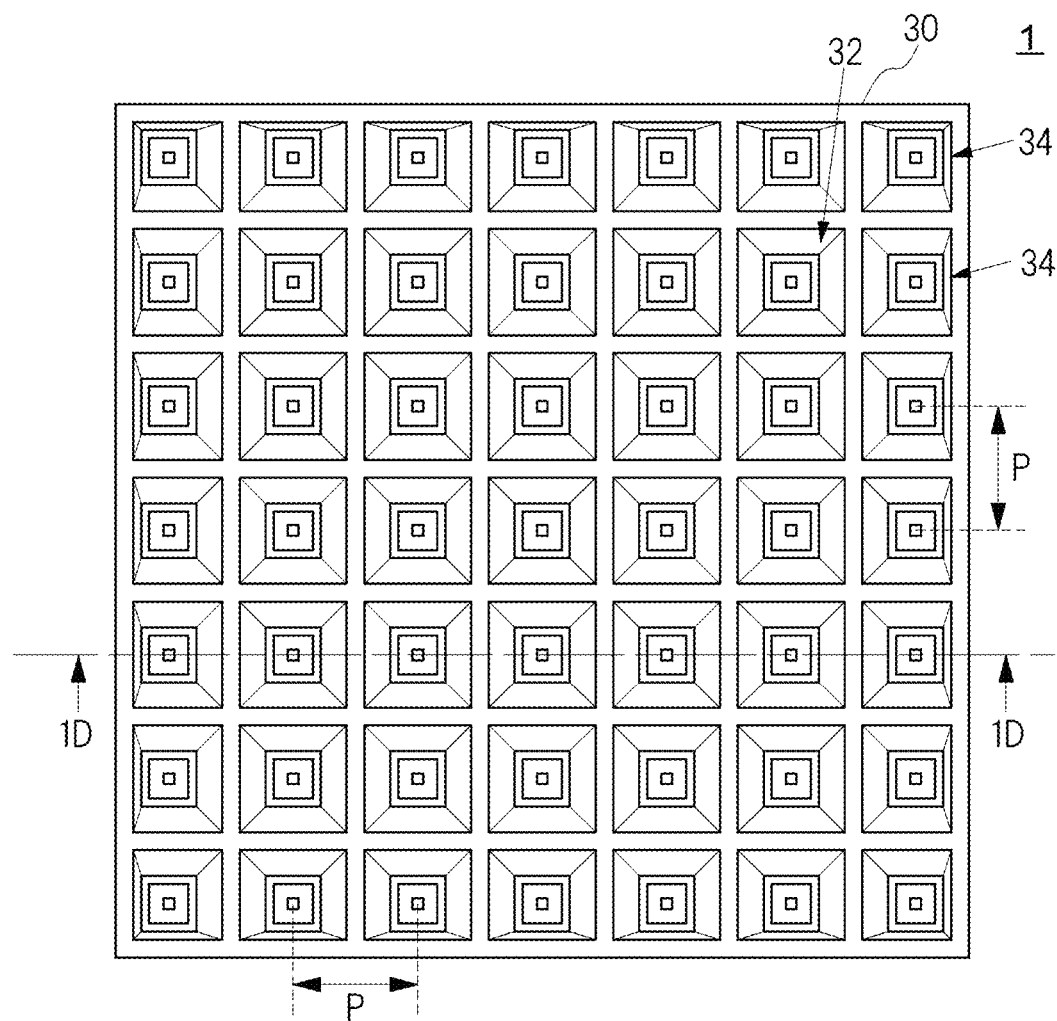
FIG. 1A is a schematic plan view of a light-emitting device according to a first embodiment.
Figure 1B:
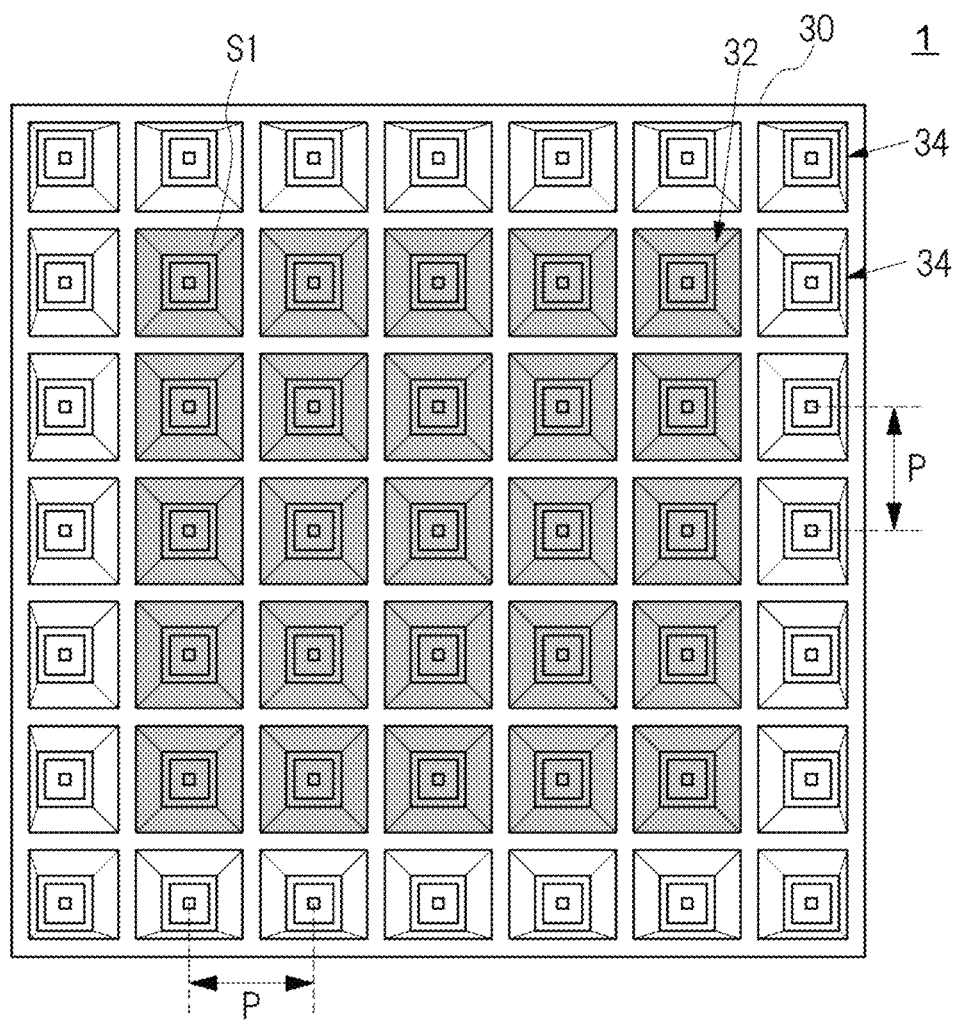
FIG. 1B is a diagram in which a plurality of first surrounding portions in FIG. 1A are shaded in gray.
Figure 1C:
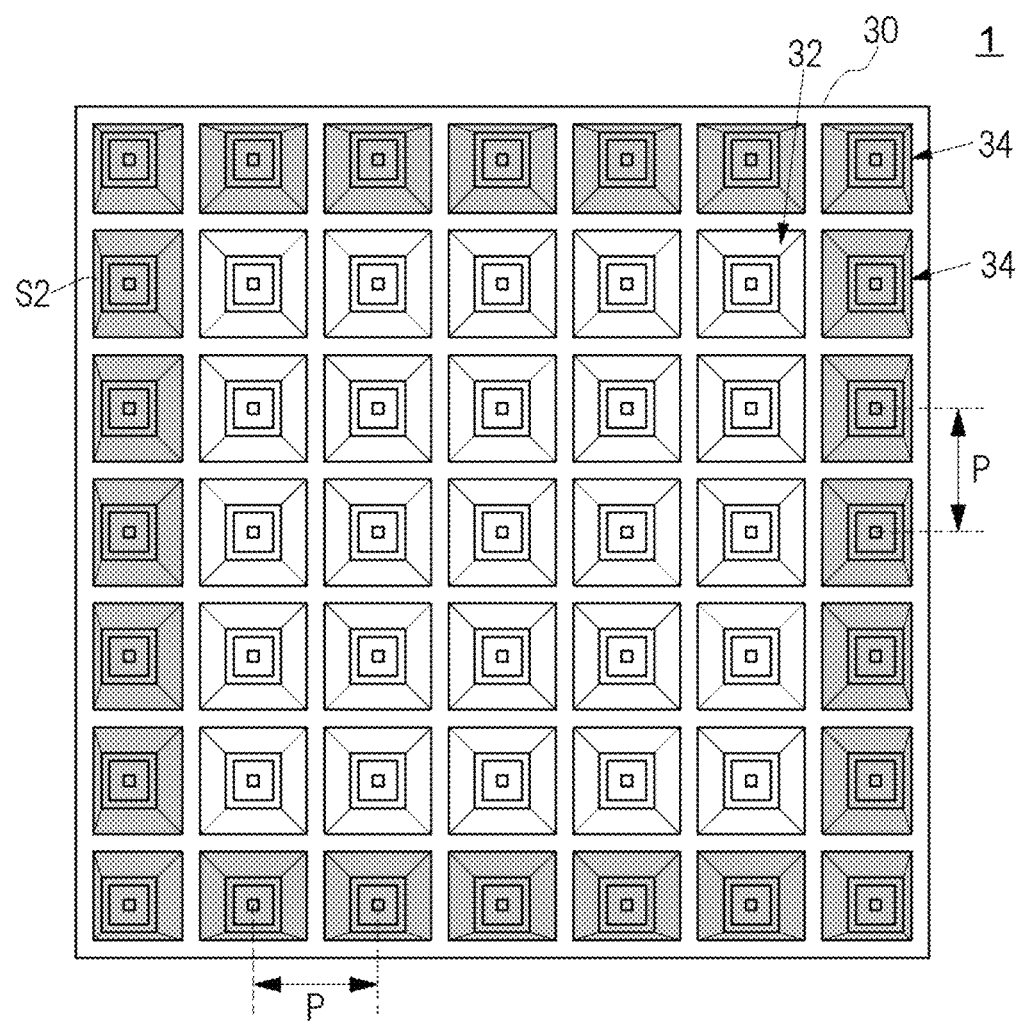
FIG. 1C is a diagram in which a plurality of second surrounding portions in FIG. 1A are shaded in gray.
Figure 1D:
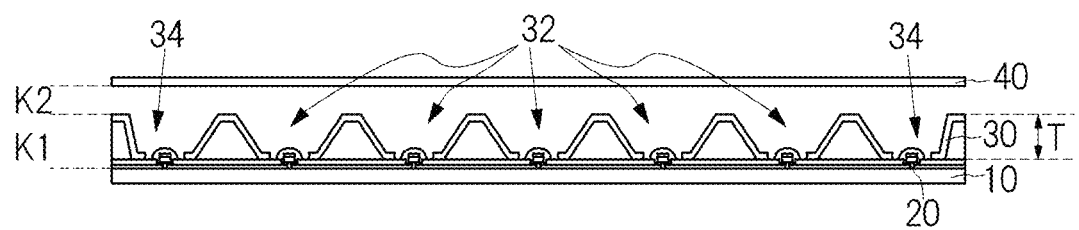
FIG. 1D is a schematic cross-sectional view taken along the line 1D-1D in FIG. 1A.
Figure 1E:
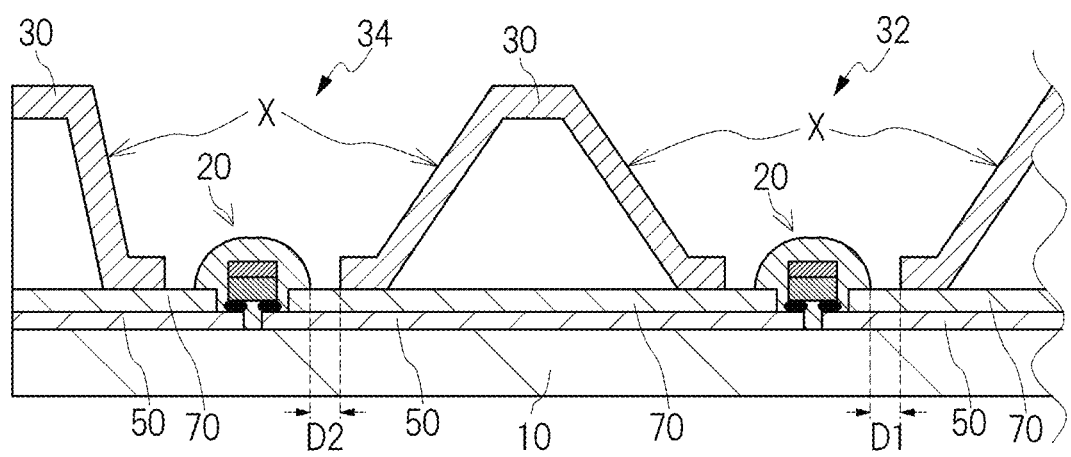
FIG. 1E is a schematic, partial, enlarged view of FIG. 1D.
Figure 1F:
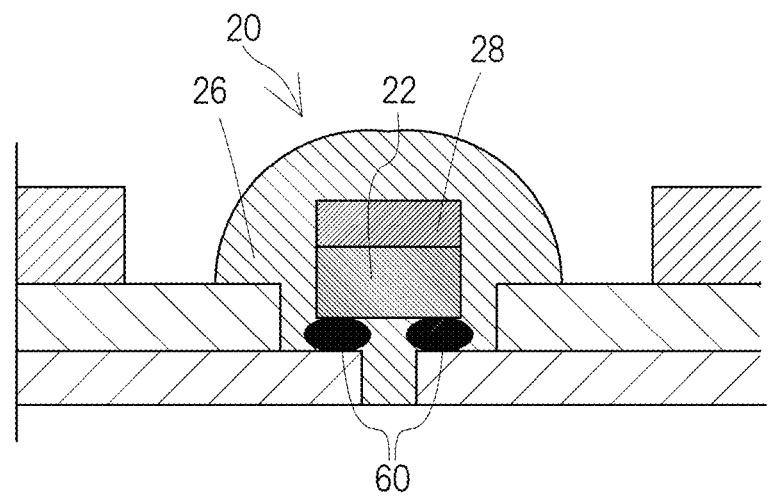
FIG. 1F is a schematic, partial, enlarged view of FIG. 1E.

FIG. 1A is a schematic plan view of a light-emitting device according to a first embodiment. FIG. 1B is a diagram in which a plurality of first surrounding portions 32 in FIG. 1A are indicated by portions shaded in gray to facilitate the understanding of the locations of the first surrounding portions 32. FIG. 1C is a diagram in which a plurality of second surrounding portions 34 in FIG. 1A are indicated by portions shaded in gray to facilitate the understanding of the locations of the second surrounding portions 34. In FIG. 1A, FIG. 1B, and FIG. 1C, only a base member 10, light-emitting elements 22, and a reflector 30 are illustrated, and illustrations of other members such as an optical member 40 are omitted, to facilitate the understanding of the shape of the reflector 30. FIG. 1D is a schematic cross-sectional view taken along the line 1D-1D in FIG. 1A. FIG. 1E is a schematic, partial, enlarged view of FIG. 1D. FIG. 1F is a schematic, partial, enlarged view of FIG. 1E.

As shown in FIG. 1A to FIG. 1F, a light-emitting device 1 according to the first embodiment includes the base member 10, a plurality of light sources 20 on an upper surface of the base member 10, and the reflector 30 that includes a plurality of surrounding portions each surrounding a respective one of the light sources 20 in a plan view, each of the surrounding portions having inclined lateral surfaces X widened upward. The plurality of surrounding portions include the first surrounding portions 32 and the second surrounding portions 34 surrounding the first surrounding portions 32. Each of the second surrounding portions 34 has an opening area, which is an area of a region defined by the upper peripheries of the inclined lateral surfaces X, smaller than an opening area of each of the first surrounding portions 32. The details will be described below.

Light-Emitting Device 1

The light-emitting device 1 is, for example, a direct-lit backlight device.

Base Member 10

The base member 10 is a member on or above which the light sources 20 are mounted.

Examples of a material of the base member 10 include ceramics and resins, such as phenolic resins, epoxy resins, polyimide resins, BT resins, polyphthalamide (PPA), and poly(ethylene terephthalate) (PET). Examples of the ceramics include alumina, mullite, forsterite, glass ceramics, and nitride (for example, AlN) and carbide (for example, SiC) ceramics, and LTCC. In the case where a resin is used as a material of the base member 10, glass fiber or an inorganic filler, such as $SiO_2$, $TiO_2$, or $Al_2O_3$, can be mixed into the resin to improve the mechanical strength, reduce the thermal expansion coefficient, and improve the light reflectance. A metal substrate made in which an insulating layer is disposed on a surface of a metal member may be used for the base member 10.

A thickness of the base member 10 can be selected appropriately. The base member 10 may be, for example, a flexible substrate that can be manufactured using a roll-to-roll manner, or may be a rigid substrate. The rigid substrate may be a slim rigid substrate that is bendable.

Light Sources 20

The light sources 20 are disposed on or above the upper surface of the base member 10.

The intervals between the light sources 20, in other words, intervals P between adjacent light sources 20, is preferably uniform (including the case where the intervals P are varied to the extent that is small enough to be regarded as uniform) in the longitudinal and lateral directions in a plan view. With such intervals, the reflector 30 in which the size of the first surrounding portions 32 and the size of the second surrounding portions 34 are different from each other, for example, an opening area S2 of each of the second surrounding portions 34 is smaller than an opening area S1 of each of the first surrounding portions 32, allows the luminance over the outer peripheral portion of the device to be the same as the luminance over the central portion of the device without changing the arrangement of the light sources 20. Thus, designing of the light-emitting device 1 can be facilitated.

Each light source 20 may include the light-emitting element 22 such as a light-emitting diode. The light-emitting element 22 includes, for example, a light-transmissive substrate and a semiconductor layer layered on the substrate. For example, sapphire can be used for the light-transmissive substrate. The semiconductor layer includes, for example, an n-type semiconductor layer, an active layer, and a p-type semiconductor layer in this order from a substrate side. For example, ZnSe, a nitride semiconductor ($In_xAl_yGa_{1-x-y}N$, $0 \leq X$, $0 \leq Y$, $X+Y \leq 1$), GaP, GaAlAs, or AlInGaP, can be used for the semiconductor layer. For example, an n-side electrode is formed on the n-type semiconductor layer, and a p-side electrode is formed on the p-type semiconductor layer.

Each light source 20 may include a sealing member 26. The sealing member 26 protects the light-emitting element 22 against external environments and optically controls light that is output from the light-emitting element 22. The sealing member 26 is disposed on or above the base member 10 to cover the light-emitting element 22.

Examples of the material for the sealing member 26 include an epoxy resin, a silicone resin, a mixture of these resins, and light-transmissive materials such as glass. Among these materials, a silicone resin is preferably selected in consideration of light resistance and ease of molding. The sealing member 26 can contain a light-diffusing agent, a wavelength conversion member, such as a phosphor, that is adapted to absorb light emitted from the light-emitting element 22 and emit light with a wavelength different from the wavelength of light emitted from the light-emitting element 22, and a coloring agent corresponding to the emission color of the light-emitting element 22.

The sealing member 26 can be formed by, for example, molding such as compression molding or injection molding, dropping, or drawing. Alternatively, by optimizing the viscosity of a material of the sealing member 26, the shape of the sealing member 26 can be controlled due to surface tension of the material of the sealing member 26. In the case of forming the sealing member 26 by dropping or drawing, the sealing member 26 can be formed in a simpler manner without using molds. Adjustment of the viscosity may be achieved by employing a material having a desired viscosity as a material of the sealing member 26, or by using the light-diffusing material as described above, wavelength conversion member, or coloring agent.

Each light source 20 preferably has a batwing light distribution characteristic. In such a light distribution characteristic, the amount of light emitted directly upward from each light source 20 can be reduced, and a broad light distribution of the light source 20 can be achieved. Accordingly, the thickness of the light-emitting device 1 can be reduced, particularly in the case where the light-transmissive optical member 40 is disposed to face the base member 10. Thus, a light-emitting device with a small thickness can be provided while having a luminance over the outer peripheral portion of the light-emitting device that is the same with the luminance over the central portion of the light-emitting device.

As used herein, the expression "batwing light distribution characteristic" refers to a light distribution characteristic in which the luminance at the central portion is smaller than the luminance at the outer peripheral portion. Examples of the batwing light distribution characteristic include, with an optical axis L being 0°, a light distribution characteristic having an emission intensity distribution in which the emission intensity at angles with absolute values larger than 0° is increased and a light distribution characteristic having an emission intensity distribution in which the emission intensity is the highest at approximately in a range of 45° to 90°.

Each light source 20 may include a reflective layer 28 on the upper surface of the light-emitting element 22. In this case, the sealing member 26 can cover, for example, the light-emitting element 22 and a reflective layer 28. With the sealing member 26 disposed in this manner, forming the sealing member 26 into a shape such as a shape described below shown in FIG. 2A allows for easily achieving the batwing light distribution characteristic.

Figure 2A:
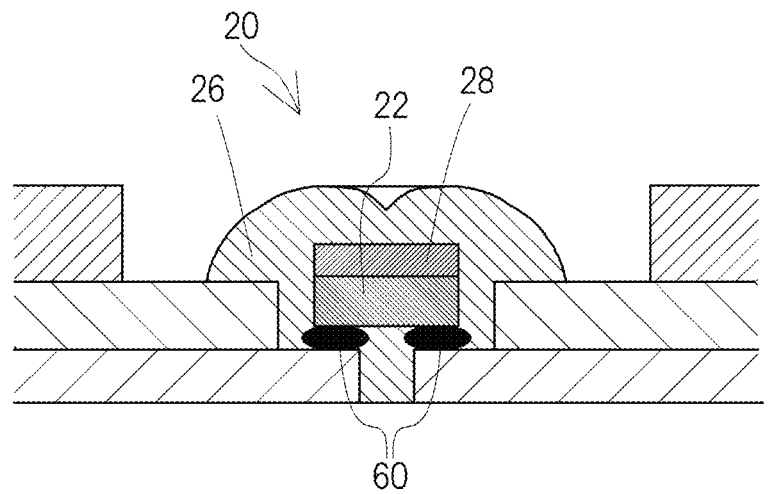
FIG. 2A is a schematic cross-sectional view of another example of a light source in the first embodiment.

FIG. 2A is a schematic cross-sectional view of another example of the light source in the first embodiment. The sealing member 26 may have, for example, a domical shape or, as shown in FIG. 2A, a shape that allows for broadening the distribution of light emitted from the light-emitting element 22, more specifically, a shape having a depressed portion directly above the light-emitting element. With this structure, the sealing member 26 functions as a lens to broaden the light distribution, and the batwing light distribution characteristic can be obtained without the reflective layer 28 as described above. Alternatively, the combination of the reflective layer 28 and the sealing member 26 that functions as a lens allows for obtaining the batwing light distribution characteristic more easily.

Figure 2B:
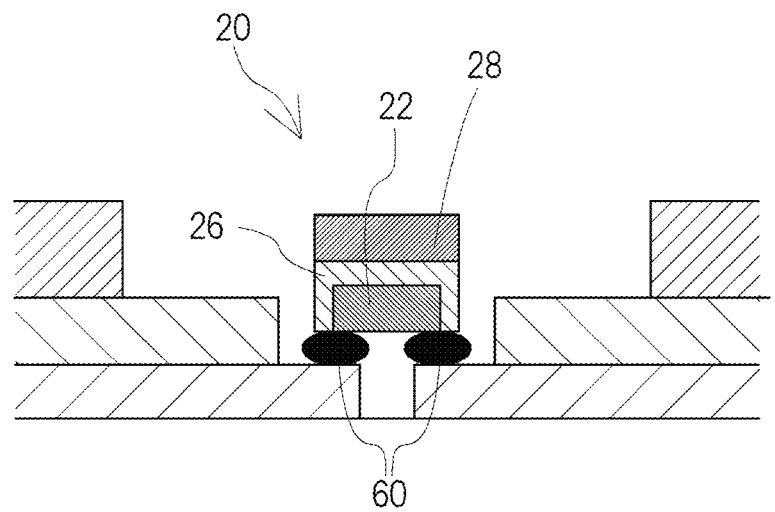
FIG. 2B is a schematic cross-sectional view of still another example of a light source in the first embodiment.

FIG. 2B is a schematic cross-sectional view of still another example of the light source in the first embodiment. Each light source 20 may include a reflective layer 28 over a sealing member 26 as shown in FIG. 2B. With this structure, the reflective layer 28 reflects light emitted upward from the light-emitting element 22, so that the amount of light emitted directly upward from the light-emitting element 22 can be reduced. Accordingly, the batwing light distribution characteristic is easily achieved.

The reflective layer 28 may be a metal film or a dielectric multilayer film.

It is preferable that the light sources 20 can be driven separately from one another, and in particular, light control (such as local dimming and high dynamic range: HDR) can be performed with respect to each of the light sources 20.

Reflector 30

The reflector 30 reflects light emitted from the light sources 20. The reflector 30 preferably has an average reflectance of 70% or more of light emitted from the light sources 20 in a wavelength range of 440 nm to 630 nm. For example, a resin member containing a reflective material made of particles of a metal oxide such as titanium oxide, aluminum oxide, or silicon oxide, or a member in which a reflective member is disposed on a surface of a resin member containing no reflective material can be used for the reflector 30.

The reflector 30 includes a plurality of surrounding portions, each of which surrounding a respective one of the plurality of light sources 20 in a plan view. A single surrounding portion surrounds a single light source. The plurality of surrounding portions include the first surrounding portions 32 and the second surrounding portions 34 surrounding the first surrounding portions 32. The opening area S2 of each of the second surrounding portions 34 is smaller than the opening area S1 of each of the first surrounding portions 32. This structure allows the light density over the second surrounding portions 34 to be higher than the light density over the first surrounding portions 32, and thus allows the light density at the outer peripheral portion of the light-emitting device to be higher than the light density at the central portion of the light-emitting device. The "opening area" as used herein refers to an area of a region defined by the upper peripheries of the inclined lateral surfaces X. Further, the "light density" refers to the degree of intensity of light per unit area.

The reflector 30 has openings of a substantially rectangular shape, each of which is defined by upper peripheries of the inclined lateral surfaces of the reflector 30. With the plurality of surrounding portion each having the opening of a substantially rectangular shape, luminance over the light-emitting device can be closer to uniform throughout the light-emitting device.

The reflector 30 has a thickness T in a range of, for example, 100 μm to 300 μm. Each of the plurality of surrounding portions of the reflector 30 has inclined lateral surfaces X widened upward. The plurality of surrounding portions of the reflector 30 each preferably have a planar portion extending from the lower ends of the inclined lateral surfaces X toward the light source 20. In FIG. 1E, an inclination angle of each of the inclined lateral surfaces X of the second surrounding portion 34 is larger than an inclination angle of each of the inclined lateral surfaces X of the first surrounding portion 32.

Figure 4A:
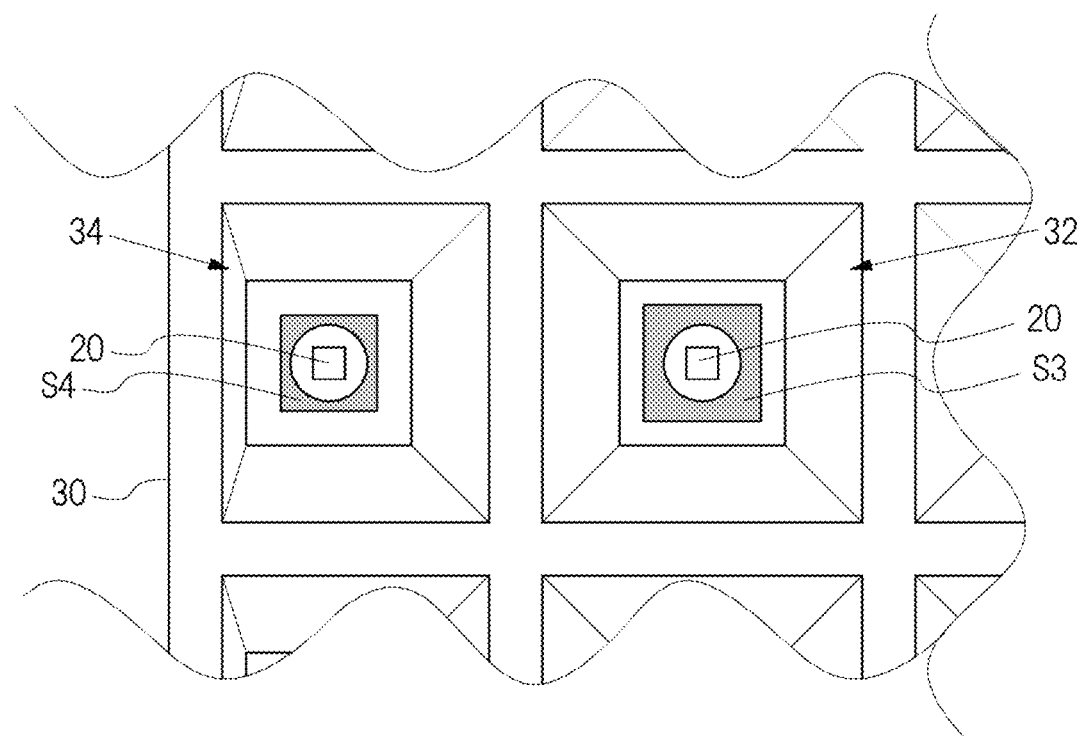
FIG. 4A is a diagram in which openings of an insulating member in a first surrounding portion and a second surrounding portion in the schematic, partial, enlarged view of FIG. 1A are shaded in gray.
Figure 4B:
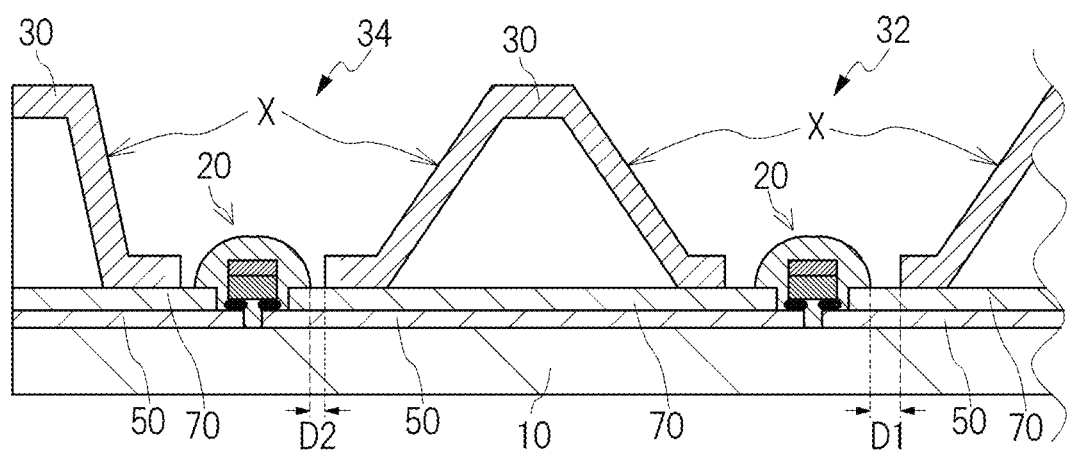
FIG. 4B is a schematic cross-sectional view of still another example of a reflector in the first embodiment.

A distance D2 between an end portion of the planar portion of the second surrounding portion 34 at a light source 20 side and an end portion of its corresponding light source 20 is preferably smaller than a distance D1 between an end portion of the planar portion of the first surrounding portion 32 at the light source 20 side and an end portion of its corresponding light source 20 as shown in, for example, FIG. 4B. This structure allows the light density over the second surrounding portions 34 to be higher than the light density over the first surrounding portions 32, so that the light density over the surrounding portions at the outer peripheral portion of the light-emitting device higher than the light density over the surrounding portions at the central portion of the light-emitting device.

Figure 3:
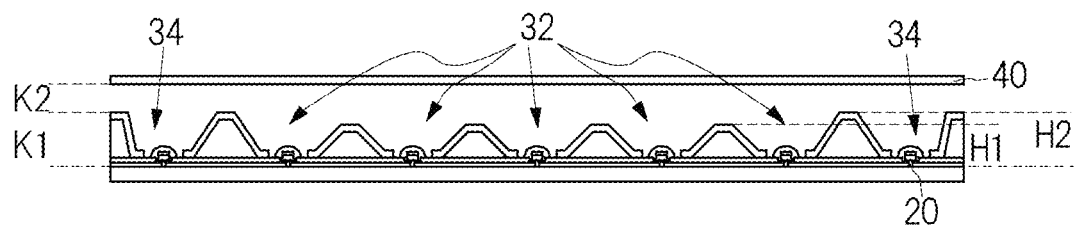
FIG. 3 is a schematic cross-sectional view of another example of a reflector in the first embodiment.

FIG. 3 is a schematic cross-sectional view of another example of a reflector in the first embodiment. A height H2 between the upper surface of the base member 10 and an upper periphery of each of the inclined lateral surfaces X of the second surrounding portions 34 is preferably greater than a height H1 between the upper surface of the base member 10 and an upper periphery of each of the first surrounding portions 32 as shown in FIG. 3. This structure allows for increasing the amount of light that is multiple-reflected within the second surrounding portions 34, which allows for further increasing light density over the second surrounding portions 34, so that the luminance over the outer peripheral portion of the light-emitting device can be increased.

Optical Member 40

The optical member 40 faces the base member 10 across a plurality of light sources 20. A distance K2 between an upper periphery of each of the inclined lateral surfaces X and the optical member 40 is preferably equal to or less than a half of a distance K1 between the upper surface of the base member 10 and an upper periphery of each of the inclined lateral surfaces X. This structure allows a depth of each of the first surrounding portions 32 and a depth of each of the second surrounding portions 34 to be relatively greater than the distance between the reflector 30 and the optical member 40, so that the number of repetitions of multiple reflection of light within the first surrounding portions 32 and the second surrounding portions 34 can be increased. Accordingly, the light density of light from each surrounding portion at the optical member 40 can be enhanced.

For example, a light-transmissive member such as a half mirror can be used for the optical member 40. For the half mirror, for example, a material that reflects a part of incident light and transmits the other part of the light can be used.

The half mirror preferably has a reflectance with respect to a light incident in an oblique direction lower than a reflectance thereof with respect to a light incident in a perpendicular direction. That is, the half mirror preferably has a property in which a reflectance of the half mirror with respect to a light emitted from each light source 20 and emitted parallel to the optical axis direction is high and a light reflectance decreases in accordance with increase in the radiation angle (in other words, the property in which the amount of light transmitted through the half mirror increases). As used herein, the light parallel to the optical axis direction is regarded to have a radiation angle of 0°. This structure easily allows for providing a uniform luminance distribution when the half mirror is observed from the emission surface.

For example, a dielectric multilayer film can be used for the half mirror. With the use of a dielectric multilayer film, a reflective film with low light absorption can be obtained. Further, the reflectance can be adjusted by changing the design of the film as desired, and the reflectance with respect to angle of emitted light can be controlled. For example, with the dielectric multilayer film designed to have a reflectance with respect to a light incident in an oblique direction with respect to the half mirror lower than a reflectance thereof with respect to a light incident perpendicularly on the half mirror, a property can be easily realized in which a reflectance with respect to light incident perpendicularly on the light-extracting surface is higher and a reflectance decreases in accordance with increase in the angle of an incident light with respect to the light-extracting surface.

The light-emitting device 1 may include a light diffusing plate at an emission surface side of the optical member 40. The light diffusing plate diffuses light emitted from a plurality of light sources 20 to reduce unevenness in luminance. For the light diffusing plate, a material that absorbs little visible light, such as a polycarbonate resin, a polystyrene resin, an acrylic resin, or a polyethylene resin can be used. For example, a member that contains a base material and a material having a refractive index different from the refractive index of the base material, or a member made of a base material and having a surface that is processed so as to scatter light can be used for the light diffusing plate.

Conductor Wiring 50

Conductor wiring 50 for supplying electricity to the light sources 20 (i.e., light-emitting elements 22) can be disposed on a surface of the base member 10. The conductor wiring 50 is electrically connected to electrodes of the light sources 20 (i.e., light-emitting elements 22) and is configured to supply a current (i.e., electricity) from outside.

A material of the conductor wiring 50 can be appropriately selected in accordance with a material used for the base member 10 and a method of manufacturing the base member 10. For example, in the case where a ceramic is used as a material of the base member 10, a material of the conductor wiring 50 is preferably a material having a melting point that is high enough to endure sintering temperatures of a ceramic sheet. A metal with a high melting point, such as tungsten and molybdenum, is preferably used as a material of the base member 10. In addition, a member in which a surface of a metal member made of such a metal is covered with another metal material, such as nickel, gold, and silver, by plating, sputtering, vacuum evaporation, or the like can be used as the conductor wiring 50. In the case where a glass epoxy resin is used as a material of the base member 10, a material that is easy to process is preferably used as a material of the conductor wiring 50.

The conductor wiring 50 can be formed on one or both of opposite surfaces of the base member 10 by using a method such as vapor deposition, sputtering, or plating. Metal foil attached to the base member 10 by pressing may serve as the conductor wiring 50. The conductor wiring 50 can be patterned to have a predetermined shape by forming a mask on the conductor wiring 50 by printing or photolithography and then performing etching using the mask.

Bonding Members 60

The light-emitting device 1 may include bonding members 60. The bonding members 60 fix the light sources 20 to the base member 10 and/or the conductor wiring 50. Examples of the bonding members 60 include insulating resins and electrically-conductive members. In the case where the light sources 20 are flip-chip mounted, electrically-conductive members can be used for the bonding members 60. Examples of the bonding members 60 include Au-containing alloys, Ag-containing alloys, Pd-containing alloys, In-containing alloys, Pb—Pd-containing alloys, Au—Ga-containing alloys, Au—Sn-containing alloys, Sn-containing alloys, Sn—Cu-containing alloys, Sn—Cu—Ag-containing alloys, Au—Ge-containing alloys, Au—Si-containing alloys, Al-containing alloys, Cu—In-containing alloys, and mixtures of metals and fluxes.

For example, a member in a form of liquid, paste, or solid (sheet-shaped, block-shaped, powdered, or wire-shaped) may be used singly or in combination for the bonding members 60. Appropriate materials can be selected for the bonding members 60 in accordance with the shape of the base member 10 and the composition. In the case where electrically connecting the light sources 20 to the conductor wiring 50 and mounting or fixing the light sources 20 on or above the base member 10 are not performed at once but are performed separately, wires other than the bonding members 60 can be used to electrically connect the light sources to the conductor wiring 50.

Insulating Member 70

An insulating member 70 such as a resist may be disposed above the base member 10 to insulate and cover the conductor wiring 50. With the insulating member 70, the conductor wiring 50 can be insulated. Also, the insulating member 70 containing a white filler can reflect light and can reduce leakage and absorption of light, so that light extraction efficiency of the light-emitting device 1 can be increased. For the insulating member 70, any appropriate insulating material can be increased, and a material that absorbs little light emitted from the light-emitting elements 22 is particularly preferable. Specific examples of the material used for the insulating member 70 include an epoxy resin, a silicone resin, a modified silicone resin, a urethane resin, an oxetane resin, an acrylic resin, a polycarbonate resin, and a polyimide resin.

The insulating member 70 preferably covers a surface of the base member 10 and a portion of the conductor wiring 50 not electrically connected to the light-emitting elements 22 or other components. The regions of the surface of the base member 10 above which the light-emitting elements 22 are disposed are preferably not covered with the insulating member 70, and an area S4 of an opening of the insulating member 70 at each of the second surrounding portions 34 is preferably smaller than an area S3 of an opening of the insulating member 70 at each of the first surrounding portions 32 as shown in FIG. 4A and FIG. 4B. This structure allows for further facilitating obtaining a luminance at the outer peripheral portion of the light-emitting device similar to the luminance at the central portion of the device.

As described above, in the light-emitting device 1 according to the first embodiment, the light density over the surrounding portions in the outer peripheral portion of the light-emitting device is higher than the light density over the surrounding portions in the central portion of the light-emitting device. Accordingly, a luminance over the outer peripheral portion of the light-emitting device can be similar to a luminance over the central portion of the light-emitting device, so that the luminance over the light-emitting device can be more uniform throughout the device.

Light-Emitting Device 2 According to Second Embodiment

Figure 5A:
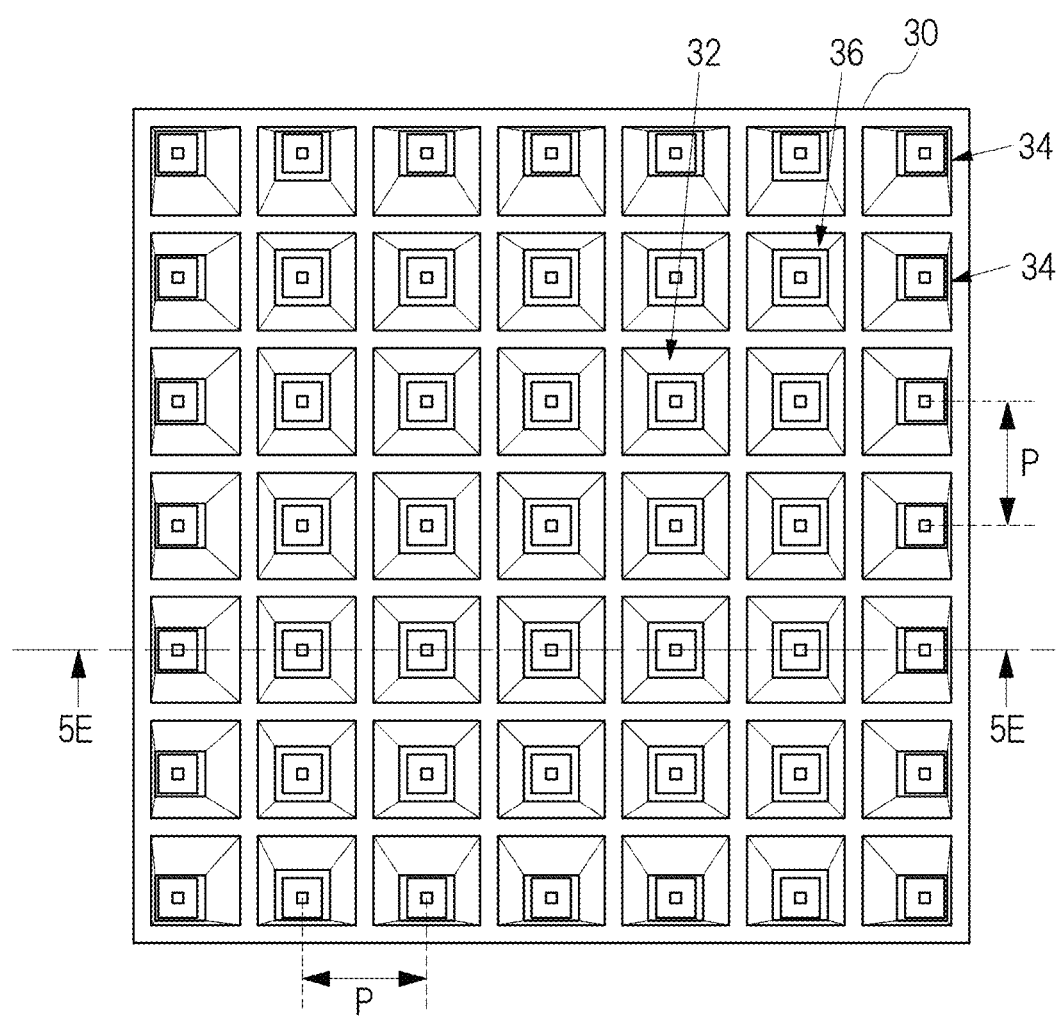
FIG. 5A is a schematic plan view of a light-emitting device according to a second embodiment.

FIG. 5A is a schematic plan view of a light-emitting device according to a second embodiment.

Figure 5B:
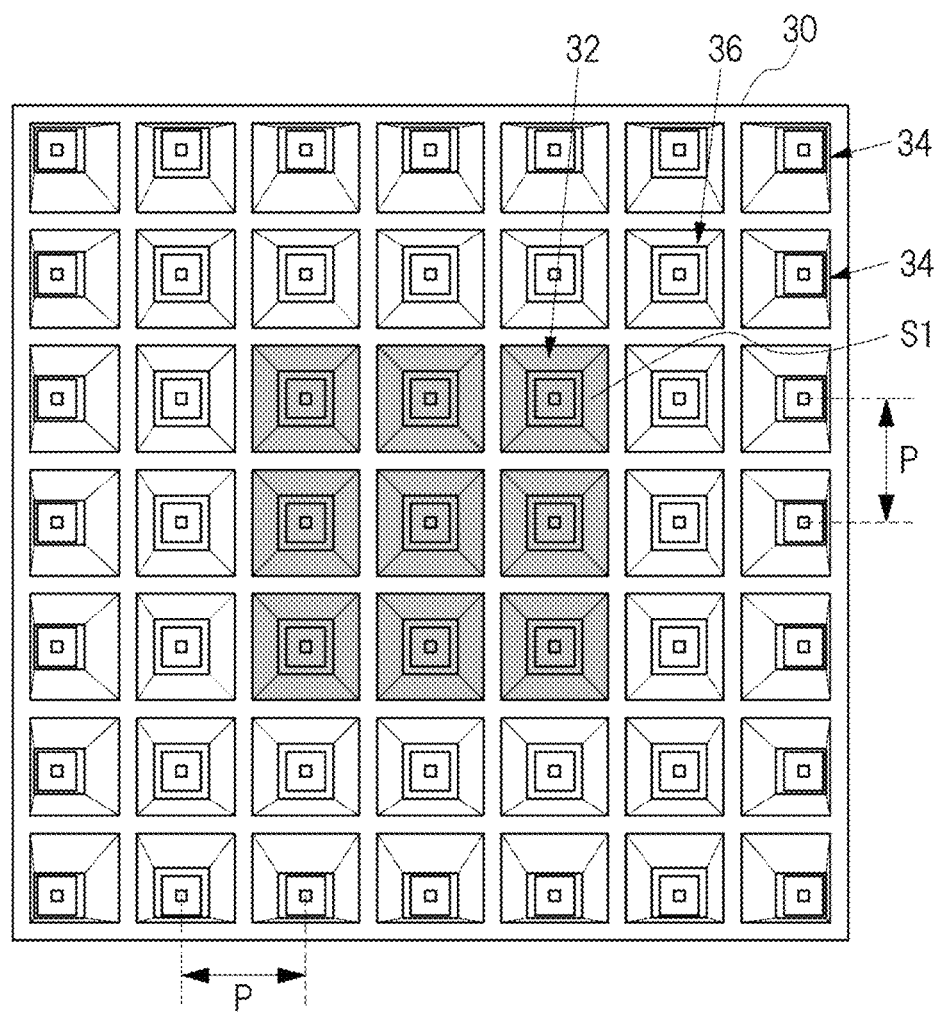
FIG. 5B is a diagram in which the first surrounding portions in FIG. 5A are indicated by portions shaded in gray.
Figure 5C:
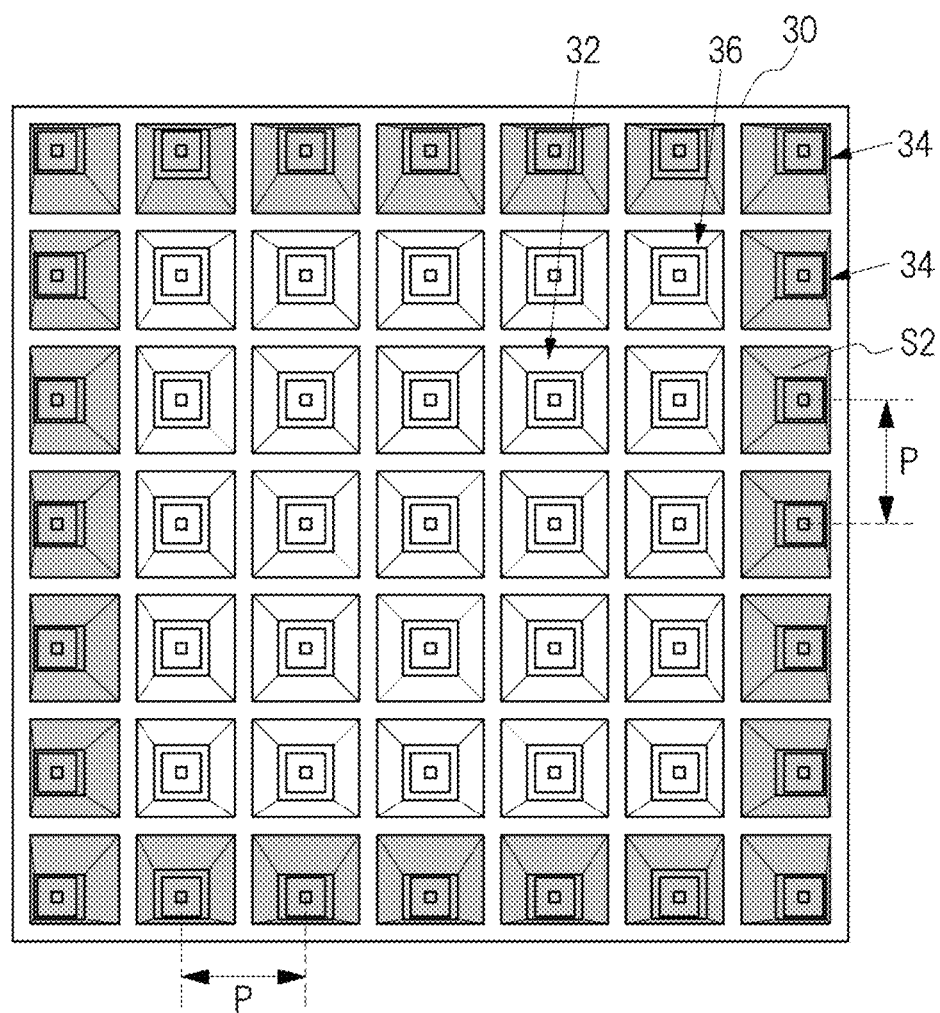
FIG. 5C is a diagram in which the second surrounding portions in FIG. 5A are shaded in gray.
Figure 5D:
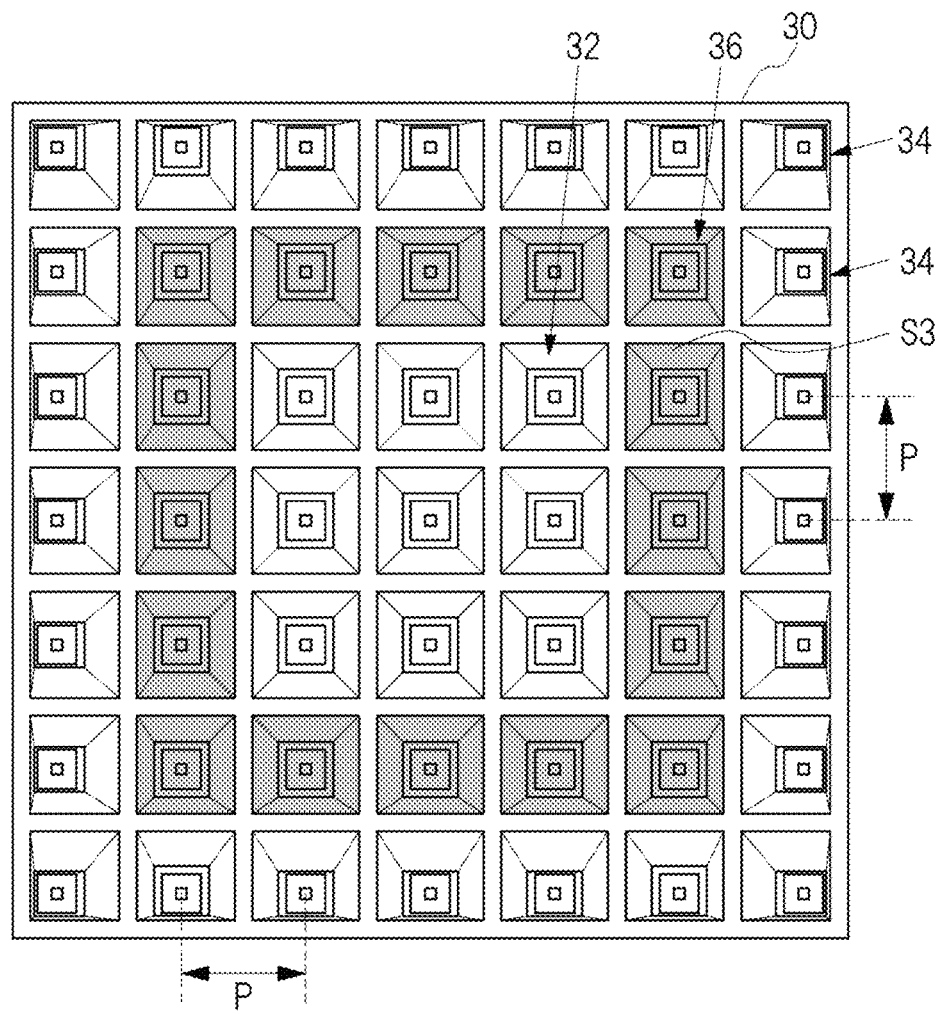
FIG. 5D is a diagram in which a plurality of third surrounding portions in FIG. 5A are shaded in gray.
Figure 5E:
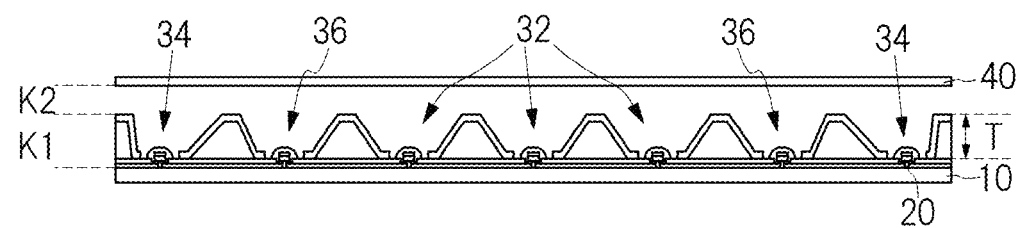
FIG. 5E is a schematic cross-sectional view taken along the line 5E-5E in FIG. 5A.

FIG. 5B is a diagram in which the first surrounding portions 32 in FIG. 5A are shaded in gray to facilitate the understanding of the locations of the first surrounding portions 32. FIG. 5C is a diagram in which the second surrounding portions 34 in FIG. 5A are shaded in gray to facilitate the understanding of the locations of the second surrounding portions 34. FIG. 5D is a diagram in which a plurality of third surrounding portions 36 in FIG. 5A are shaded in gray to facilitate the understanding of the locations of the third surrounding portions 36. FIG. 5E is a schematic cross-sectional view taken along the line 5E-5E in FIG. 5A.

As shown in FIG. 5A to FIG. 5E, a light-emitting device 2 according to the second embodiment differs from the light-emitting device 1 according to the first embodiment in that the plurality of surrounding portions further include the third surrounding portions 36 between the first surrounding portions 32 and the second surrounding portions 34, and that the opening area S3, which is an area of a region defined by the upper peripheries of the inclined lateral surfaces X of each of the third surrounding portions 36, is smaller than the opening area S1 of each of the first surrounding portions 32 and larger than the opening area S2 of each of the second surrounding portions 34. Other configurations of the light-emitting device 2 is the same as those of the light-emitting device 1. In the light-emitting device 2 according to the second embodiment, the relationship of the light density over the second surrounding portions 34>the light density over the third surrounding portions 36>the light density over the first surrounding portions 32 is satisfied, and the light density over the light-emitting device is gradually increased from the central portion toward the outer peripheral portion of the device. Accordingly, a luminance over the outer peripheral portion of the device similar to the luminance over the central portion of the device can be obtained, so that the luminance over the device can be even more uniform throughout the light-emitting device.

Certain embodiments of the present invention have been described above, but descriptions thereof do not limit the scope of the present invention.

What is claimed is:

1. A light-emitting device comprising:
   a base member;
   a plurality of light sources arranged on or above an upper surface of the base member at intervals in a lateral direction and a longitudinal direction; and
   a reflector that comprises a plurality of surrounding portions, each of the plurality of surrounding portions surrounding a respective one of the plurality of light sources in a plan view, each of the plurality of surrounding portions having four inclined lateral surfaces widened upward,
   wherein intervals between adjacent ones of the plurality of light sources in both the lateral and longitudinal directions are substantially constant in the plan view,
   wherein upper peripheries of the inclined lateral surfaces of each of the plurality of surrounding portions define an opening having, in the plan view, a substantially rectangular shape with four substantially straight sides,
   wherein the plurality of surrounding portions include a plurality of first surrounding portions and a plurality of second surrounding portions surrounding the plurality of first surrounding portions,
   wherein an area of the opening of each of the plurality of second surrounding portions is smaller than an area of the opening of each of the plurality of first surrounding portions.

2. The light-emitting device according to claim 1,
   wherein the plurality of surrounding portions further include a plurality of third surrounding portions,
   wherein the third surrounding portions are disposed between the first surrounding portions and the second surrounding portions, and
   wherein an area of the opening of each of the plurality of the third surrounding portions is smaller than the area of the opening of each of the first surrounding portions and larger than the area of the opening of each of the second surrounding portions in the opening area.

3. The light-emitting device according to claim 2, wherein each of the light sources has a batwing light distribution characteristic.

4. The light-emitting device according to claim 3, wherein each of the light sources comprises:
   a light-emitting element, and
   a lens adapted to broaden a distribution of light emitted from the light-emitting element.

5. The light-emitting device according to claim 2, wherein each of the light sources comprises:
   a light-emitting element, and
   a lens adapted to broaden a distribution of light emitted from the light-emitting element.

6. The light-emitting device according to claim 2, further comprising a light-transmissive optical member facing the base member across the plurality of light sources,
   wherein a distance between the upper periphery of each of the inclined lateral surfaces and the optical member is equal to or less than a half of a distance between the upper surface of the base member and the upper periphery of the inclined lateral surface.

7. The light-emitting device according to claim 1, wherein each of the light sources has a batwing light distribution characteristic.

8. The light-emitting device according to claim 7, wherein each of the light sources comprises:
   a light-emitting element, and
   a lens adapted to broaden a distribution of light emitted from the light-emitting element.

9. The light-emitting device according to claim 8, further comprising a light-transmissive optical member facing the base member across the plurality of light sources,
   wherein a distance between the upper periphery of each of the inclined lateral surfaces and the optical member is equal to or less than a half of a distance between the upper surface of the base member and the upper periphery of the inclined lateral surface.

10. The light-emitting device according to claim 3, further comprising a light-transmissive optical member facing the base member across the plurality of light sources,
    wherein a distance between the upper periphery of each of the inclined lateral surfaces and the optical member is equal to or less than a half of a distance between the upper surface of the base member and the upper periphery of the inclined lateral surface.

11. The light-emitting device according to claim 1, wherein each of the light sources comprises:
    a light-emitting element, and
    a lens adapted to broaden a distribution of light emitted from the light-emitting element.

12. The light-emitting device according to claim 11, further comprising a light-transmissive optical member facing the base member across the plurality of light sources,
    wherein a distance between the upper periphery of each of the inclined lateral surfaces and the optical member is equal to or less than a half of a distance between the upper surface of the base member and the upper periphery of the inclined lateral surface.

13. The light-emitting device according to claim 1, wherein each of the light sources comprises:
    a light-emitting element,
    a sealing member covering the light-emitting element, and
    a reflective layer above the sealing member.

14. The light-emitting device according to claim 1, wherein each of the light sources comprises:
    a light-emitting element having an upper surface, a reflective layer on the upper surface of the light-emitting element, and a sealing member covering the light-emitting element and the reflective layer.

15. The light-emitting device according to claim 14, further comprising a light-transmissive optical member facing the base member across the plurality of light sources, wherein a distance between the upper periphery of each of the inclined lateral surfaces and the optical member is equal to or less than a half of a distance between the upper surface of the base member and the upper periphery of the inclined lateral surface.

16. The light-emitting device according to claim 1, further comprising a light-transmissive optical member facing the base member across the plurality of light sources, wherein a distance between the upper periphery of each of the inclined lateral surfaces and the optical member is equal to or less than a half of a distance between the upper surface of the base member and the upper periphery of the inclined lateral surface.

17. The light-emitting device according to claim 16, wherein the optical member comprises a half mirror made of a dielectric multilayer film, the half mirror adapted to reflect a part of incident light and to transmit the other part of the light.

18. The light-emitting device according to claim 1, wherein the reflector includes planar portions each extending from a lower end of each of the inclined lateral surfaces toward a corresponding one of the plurality of light sources, and wherein a distance between an end portion of the planar portion of each of the second surrounding portions at a light source side and an end portion of a corresponding one of the light sources is smaller than a distance between an end portion of the planar portion of each of the first surrounding portions at the light source side and an end portion of a corresponding one of the light sources.

19. The light-emitting device according to claim 1, wherein a height between the upper surface of the base member and the upper periphery of the inclined lateral surface of each of the second surrounding portions is greater than a height between the upper surface of the base member and an upper periphery of each of the first surrounding portions.

20. The light-emitting device according to claim 1, the light-emitting device further comprising:

conductor wirings electrically connected to corresponding ones of the light sources on a surface of the base member; and an insulating member covering a portion of each of the conductor wirings not electrically connected to the light sources.

21. The light-emitting device according to claim 1, wherein, for each of the plurality of second surrounding portions, at least one of the four inclined lateral surfaces has an equivalent area in plan view as each of the inclined lateral surfaces of the plurality of first surrounding portions, the at least one of the four inclined lateral surfaces not being closer to an outer edge of the base member than the others of the four inclined surfaces.

22. The light-emitting device according to claim 21, wherein the base member is substantially rectangular, and for at least one of the second surrounding portions located at a corner of the base member in plan view, the at least one of the four inclined lateral surfaces is comprised of the two inclined lateral surfaces located not closest to respective sides of the base member.

\* \* \* \* \*